United States Patent [19]

Mase

[11] Patent Number: 5,079,586
[45] Date of Patent: Jan. 7, 1992

[54] COLOR IMAGE RECORDING APPARATUS

[75] Inventor: Hideki Mase, Handa, Japan

[73] Assignee: Brother Kogyo Kabushiki Kaisha, Japan

[21] Appl. No.: 630,270

[22] Filed: Dec. 19, 1990

[30] Foreign Application Priority Data

Feb. 22, 1990 [JP] Japan ................................. 2-41608

[51] Int. Cl.$^5$ ...................... G03B 27/32; G03B 27/52
[52] U.S. Cl. ......................................... 355/27; 355/32
[58] Field of Search ...................... 355/27, 32, 35, 38, 355/68, 77, 100, 106

[56] References Cited

U.S. PATENT DOCUMENTS

| 4,860,059 | 8/1989 | Terashita ............................ 355/38 |
| 4,924,255 | 5/1990 | Horaguchi et al. .................. 355/27 |

FOREIGN PATENT DOCUMENTS 61-221767 10/1986 Japan .
62-273588 11/1987 Japan .
63-125055 5/1988 Japan .

*Primary Examiner*—L. T. Hix
*Assistant Examiner*—D. Rutledge
*Attorney, Agent, or Firm*—Oliff & Berridge

[57] ABSTRACT

An image recording apparatus for recording an output color image on an image recording medium, provides a cyanogen filter (or a red filter), a magenta filter (or a green filter) and a yellow filter (or a blue filter), each of them relating to a complementary (or same) color of the basic three primary colors (that is red, green and blue). Each filter is insertable into an optical path. The apparatus also provides a plurality of color designation switch buttons designating several kinds of hue colors (excepting the basic primary colors) on an operation panel of the apparatus body. The amount of the insertion of each kind of the filters into the optical path is adjustable by computer control according to the color designation switch buttons.

19 Claims, 6 Drawing Sheets

COLOR IMAGE RECORDING APPARATUS

BACKGROUND OF THE INVENTION

The present invention relates to an image recording apparatus such as a copy machine, and more particularly relates to a color image recording apparatus for adjusting the color tone balance in the output color image recorded on image recording medium.

Conventionally, in a color image recording apparatus, an operation panel has color adjustment switches for adjusting three basic primary colors, red, green and blue, from a light color to a deep color, respectively. An operator designates the respective color depth of the three basic primary colors by choice. Then, the color tone balance among each color is adjusted.

However, according to this copy machine, it cannot help but rely on the operator's intuition as to what output color image is obtained. Therefore, it was very difficult to output an image with a desired color tone balance only by adjusting three basic primary colors, red, green and blue.

SUMMARY OF THE INVENTION

Accordingly, it is an object of the present invention to overcome the above problems and to provide an image recording apparatus able to easily adjust the color tone balance by the operator.

An another object of the present invention is to provide an image recording apparatus for making the color adjustment operation handy and being able to record an image promptly.

According to the present invention, there is provided an image recording apparatus comprising: basic color designation means for designating three basic primary colors respectively; non-basic color designation means for designating hue colors between each of the three basic primary colors; a plurality of color light filters in the relation of complementary colors to the three basic colors, respectively; filter drive means for inserting and removing each color light filter into and from an optical path; and filter insertion amount control means for operating the filter drive means based on the color designated by the non-basic color designation means and controlling an amount of insertion of the color filters into the optical path.

BRIEF DESCRIPTION OF THE DRAWINGS

The invention will be described in detail with reference to the following drawings, wherein.

DETAILED DESCRIPTION OF THE PREFERRED EMBODIMENTS

Figure 1:
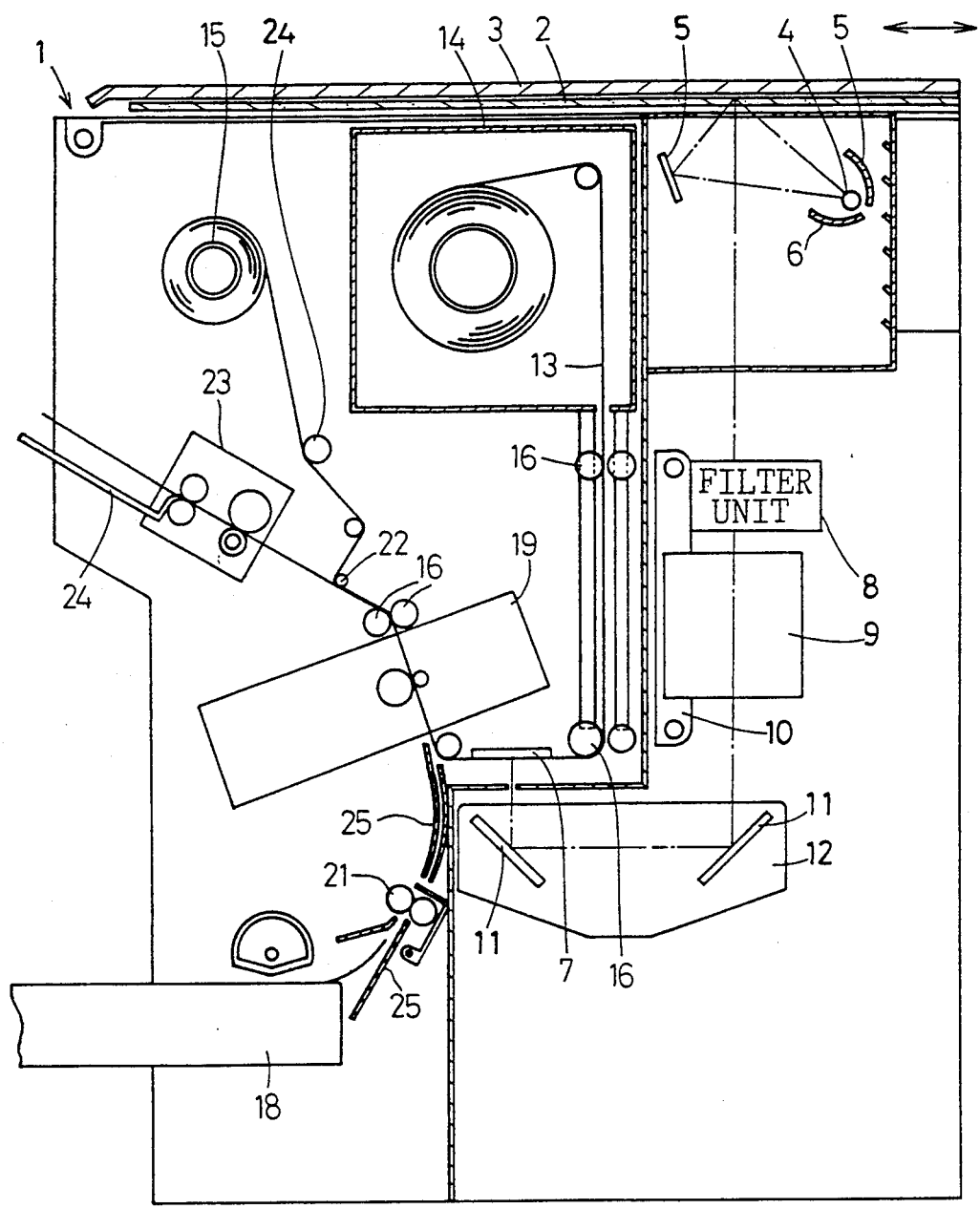
FIG. 1 is a cross-sectional view illustrating the general structure of a copying machine embodying the present invention.

A detailed description of one preferred embodiment of a color copying machine embodying the present invention will now be given referring to the accompanying drawings. As shown in FIG. disposed at the top of a copying machine body 1 are an original support stand glass 2 and a liftable cover 3. An original can be placed on the original support stand glass 2, and the cover 3 for covering this original support stand glass is movable horizontally in the direction of an arrow "A" in the diagram. Under the original support stand glass 2 lies a light source 6, which comprises a halogen lamp 4 for irradiating light on an image area of an original placed on the original support stand glass 2 and reflectors 5 for reflecting light from the halogen lamp 4 toward the original support stand glass 2. As the original support stand glass 2 moves while the halogen lamp 4 of the light source 6 is emitting light, light is irradiated on the entire surface of an original.

An exposure stand 7 is disposed near the center of the copying machine body 1. A filter unit 8 for adjusting the color tone of a copying image and a focusing lens 9 are supported along an optical path between the light source 6 and exposure stand 7 by a mounting plate 10. A pair of reflection mirrors 11 for adjusting the length of the optical path and the focus are supported in an adjustable manner between the lens 9 and the exposure stand 7 by a mounting plate 12. Light irradiated on the original and reflected therefrom is led to the exposure stand 7, after passing through the filter unit 8, lens 9 and being reflected by the reflection mirrors 11.

A cartridge 14 for retaining a roll of fresh microcapsule sheet 13 is detachably disposed at an upper portion in the copying machine body 1. This microcapsule sheet 13 is a transfer type one as described in U. S. Pat. No. 4,399,209. A take-up shaft 15, on which a used portion of the microcapsule sheet fed out from the cartridge 14 is wound, is rotatably supported outside the cartridge 14. The microcapsule sheet 13 has a number of microcapsules to be affected by a cyanogen wave length light, a magenta wave length light and a yellow wave length light, such that the microcapsule carried on its surface are stiffened. The microcapsules each encapsulate dye precursor material of cyanogen color, magenta color and yellow color for color copying. The microcapsule sheet 13 is fed out from the cartridge 14 by the rotation of a plurality of feed rollers 16, which rotate at the same peripheral speed as the moving speed of the original support stand glass 2, and is then wound around the take-up shaft 15. During that time, part of the microcapsule sheet 13 which passes under the exposure stand 7 is exposed to light and a latent image of the original is formed thereon.

A cassette 18 retaining a sheet of developer paper 17 of a given size or a developer sheet having a transparent plastic film as its base material for use in an overhead projector is detachably mounted in the copying machine body 1 under the exposure stand 7. Developer for initiating chromogenic reaction with the dye precursor material is carried on the developer paper 17. A pressure developing unit 19 is disposed between the exposure stand 7 and the take-up shaft 15. As the exposed portion of the microcapsule sheet 13 and the developer paper or sheet 17 (hereinafter simply referred to as developer sheet) are pressed together in the pressure developing unit 19, a color image is formed on the developer sheet 17 based on the latent image previously formed on the microcapsule sheet 13.

Disposed between the cassette 18 and the pressure developing unit 19 are a plurality of feed rollers 21 and a sheet guide 25. The rollers 21 are rotated at the same peripheral speed as the aforementioned feed rollers 16. A separation roller 22 for separating the developer sheet 17 from the microcapsule sheet 13 is disposed on the output side of the pressure developing unit 19. A thermal fixing unit 23 for thermally fixing the image formed on the developer sheet 17 is disposed on the output side of the separation roller 22. The developer sheet 17 coming out from this unit 23 is retained in a tray 24.

Figure 2:
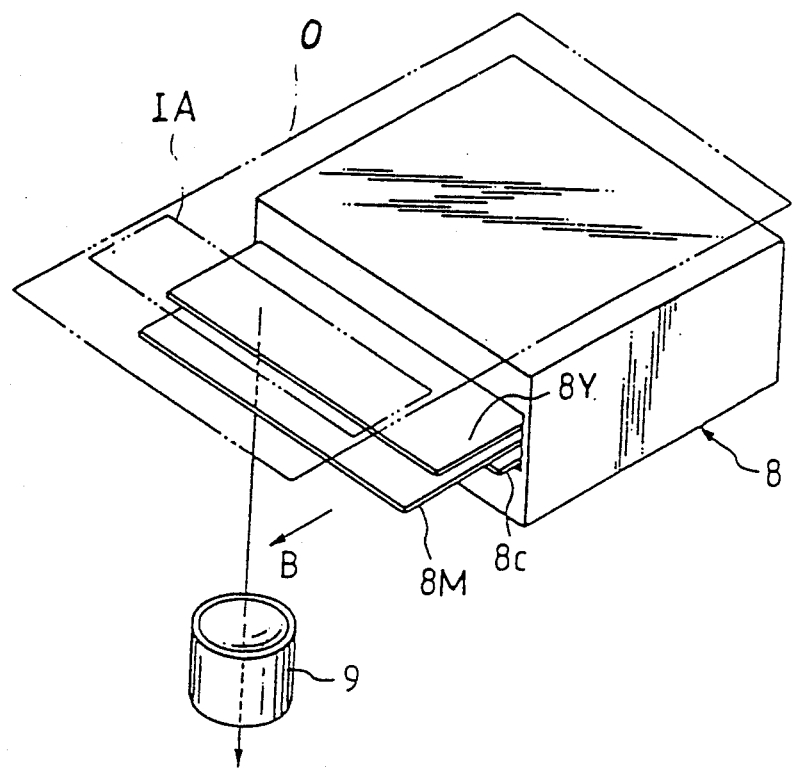
FIG. 2 is a perspective view showing an arrangement of a filter unit according to the present invention.

As shown in FIG. 2, the filter unit 8, which is disposed along the optical path, contains: 1) a yellow filter 8Y for interrupting a yellow wave length light and allowing passage (or penetration through the filter) of a magenta wave length light and a cyanogen wave length light, 2) a magenta filter 8M for interrupting a magenta wave length light and allowing passage of a yellow wave length light and a cyanogen wave length light, and 3) a cyanogen filter 8C for interrupting a cyanogen wave length light and allowing passage of a yellow wave length light and a magenta wave length light. The respective filters are horizontally extendable from the filter unit 8 to intercept the light path to the lens 9. The degree or amount of extension from the filter unit 8 can be controlled as explained below. The filter unit 8 is similar in construction to the filter unit disclosed in U.S. Pat. No. 4,924,255, the disclosure of which is herein incorporated by reference.

In FIG. 2, the original is designated with reference letter "0", and the image area with reference letters "IA". The filters are extended to intercept portions of the light reflected from the image area IA.

Figure 3:
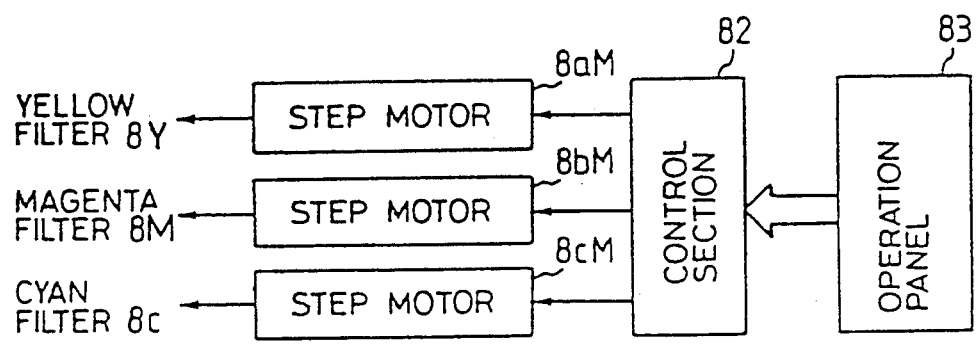
FIG. 3 is a block diagram showing one example of the filter unit driving system according to the present invention.

FIG. 3 is a block diagram showing a driving system of each filter 8C, 8M and 8Y for extending it from the filter unit 9. The respective filters 8C, 8M and 8Y are moved by the associated linear step motors 8aM, 8bM and 8cM. The linear step motors 8aM, 8bM and 8cM are connected to a control section 82 containing therein a CPU (central processing unit). The control section 82 supplies a control signal to each of the motors, and in response thereto displacement of a movable portion of the motor is controlled to move the respective filter toward or away from the filter unit 8 by a controlled amount. The control section 82 is connected to an operation panel 83 which serves as a machine interface between an operator and the control section 82. The position to which each of the filters is moved is controlled through the manipulation of the operation panel 83. Each filter is movably disposed in a plane perpendicular to the light path.

Figure 4:
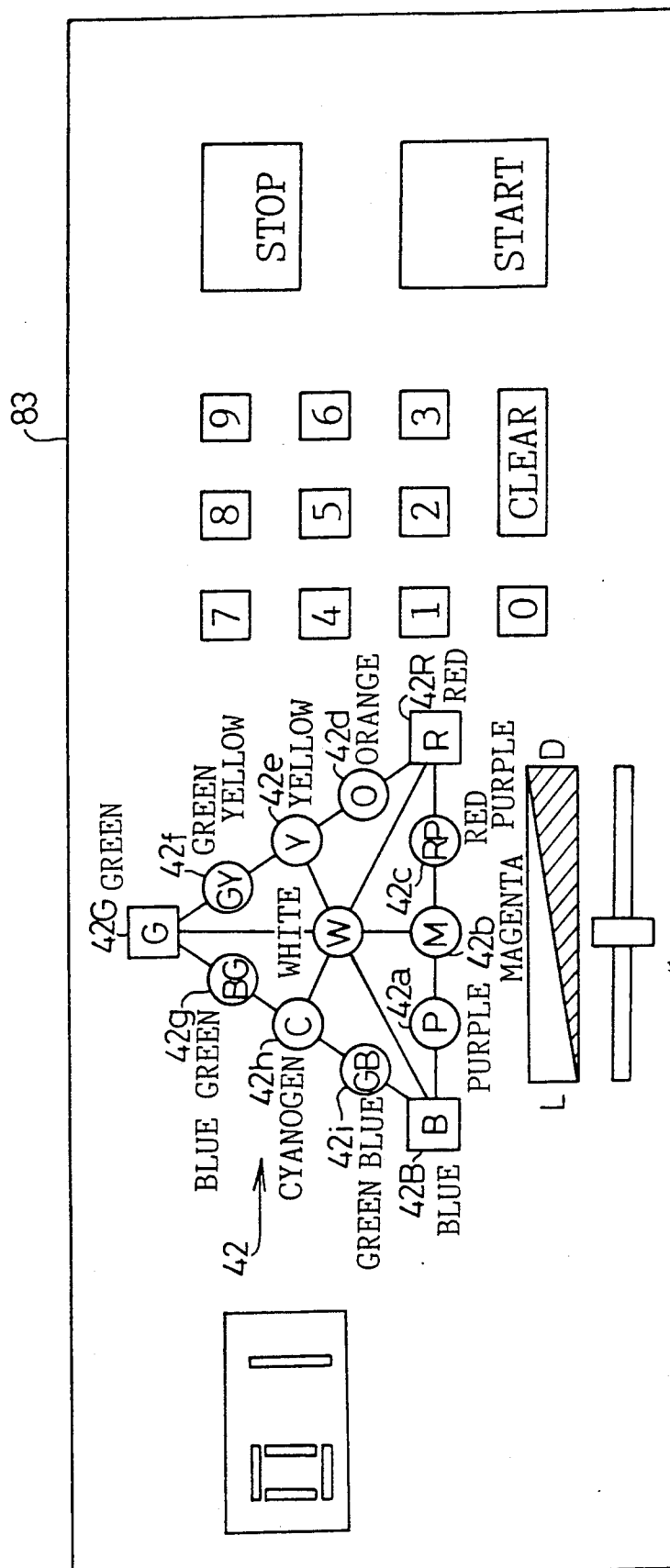
FIG. 4 is a schematic plan view showing an arrangement of color adjustment switch buttons on the operation panel.

FIG. 4 shows the operation panel 83. A start button, a stop button, a copy number of sheets specification button, a color designation switch unit 42, etc. are provided on this panel. The color designation switch unit 42 has push button switches 42R, 42G and 42B, which are Red(R), Green(G) and Blue(B) of three basic primary colors, respectively, and a plurality of push button switches 42a–42i for designation intermediate colors other than three basic primary colors. A push button switch 42j exists for designating white. The push button switches 42R, 42G and 42B are preferably located at the corners of a triangle, with the push button switches 42a–42i located along the sides of the triangle. Switch 42j is located within the triangle.

Figure 5:
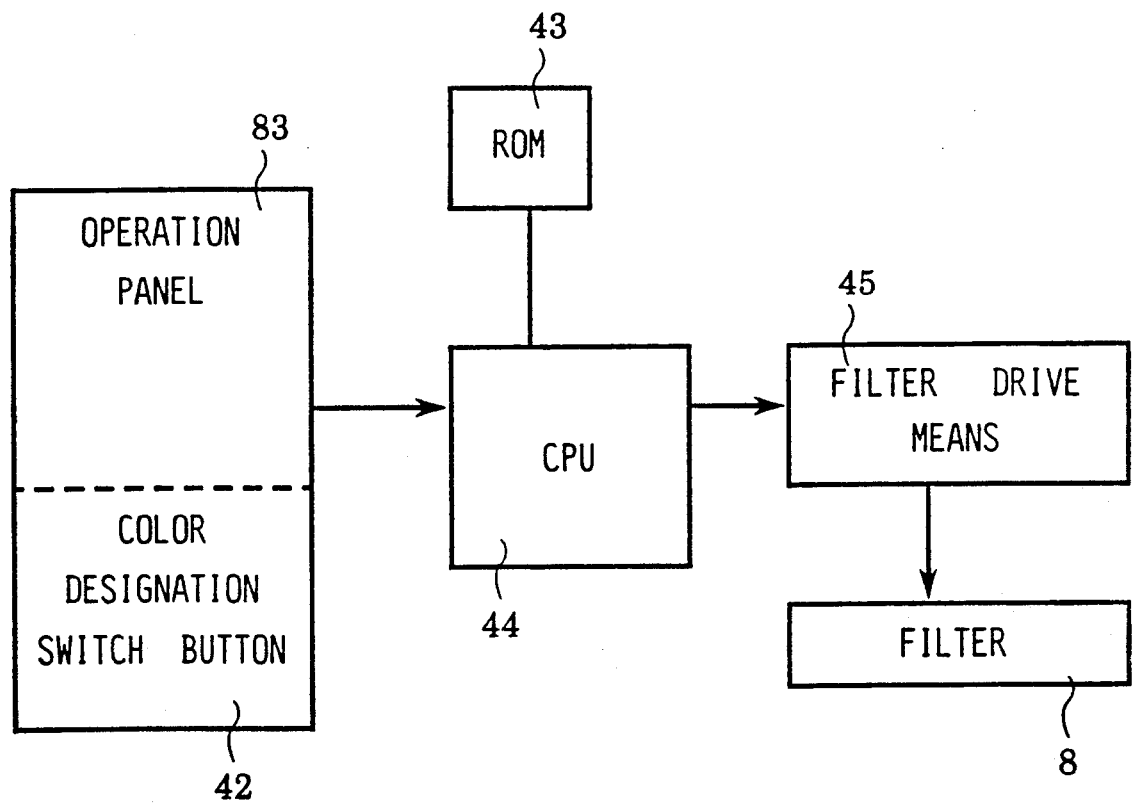
FIG. 5 is an electric block diagram showing the driving system of the color adjustment switch buttons and the filter unit.

FIG. 5 shows the detailed relation between a control section 82 and the operation panel 83 shown in the block diagram in FIG. 3. ROM (random access memory) 43 connected to CPU 44 of control section 82 stores three basic primary colors to be designated by depressing the push button switches 42R, 42G and 42B corresponding to the three basic primary colors, and each amount of insertion of filters 8C, 8M and 8Y for inserting into an optical path corresponding to colors designated by depressing the push button switches 42a–42i for intermediate colors other than three basic primary colors.

When the operator does not designate color with the color designation switch unit 42 before an exposing operation is started (or when push button switch 42j is selected), filters 8C, 8M and 8Y are not inserted into the optical path, so that a microcapsule sheet 13 is directly exposed by the reflection light reflected from the original. On the other hand, if for example the switch 42a corresponding to purple color in the color designation switch unit 42 is pushed, a Magenta filter 8M is inserted into the optical path to intercept ⅔ of the light reflected from the image area, (i.e., the filter covers ⅔ of the image area to interrupt light received by the lens 9 in the optical path); and a cyanogen filter 8C is inserted to intercept ⅓ of the light reflected from the image area of the original. As a result, the cyanogen capsules and the yellow capsules on the microcapsule sheet 13 harden respectively at the rate of ⅔ by the light passed through the magenta filter 8M, as described in U.S. Pat. No. 4,924,255, the disclosure being herein incorporated by reference. The magenta capsules and the yellow capsules on the microcapsules sheet 13 harden respectively at the rate of ⅓ by the light passed through the cyanogen filter 8C. Therefore, as non-stiffening capsules, Magenta capsules are the most abundant, Cyanogen capsules are next abundant, and Yellow capsules are the fewest. As a result, in the output image on a developer sheet, purple is emphasized. Moreover, if for example switch 42f corresponding to yellow green color in the color designation switch unit 42 is pushed, a yellow filter 8Y is inserted into the optical path to intercept ⅔ of the image area and a cyanogen filter 8C is inserted into the optical path to intercept ⅓ of the image area.

Figure 6:
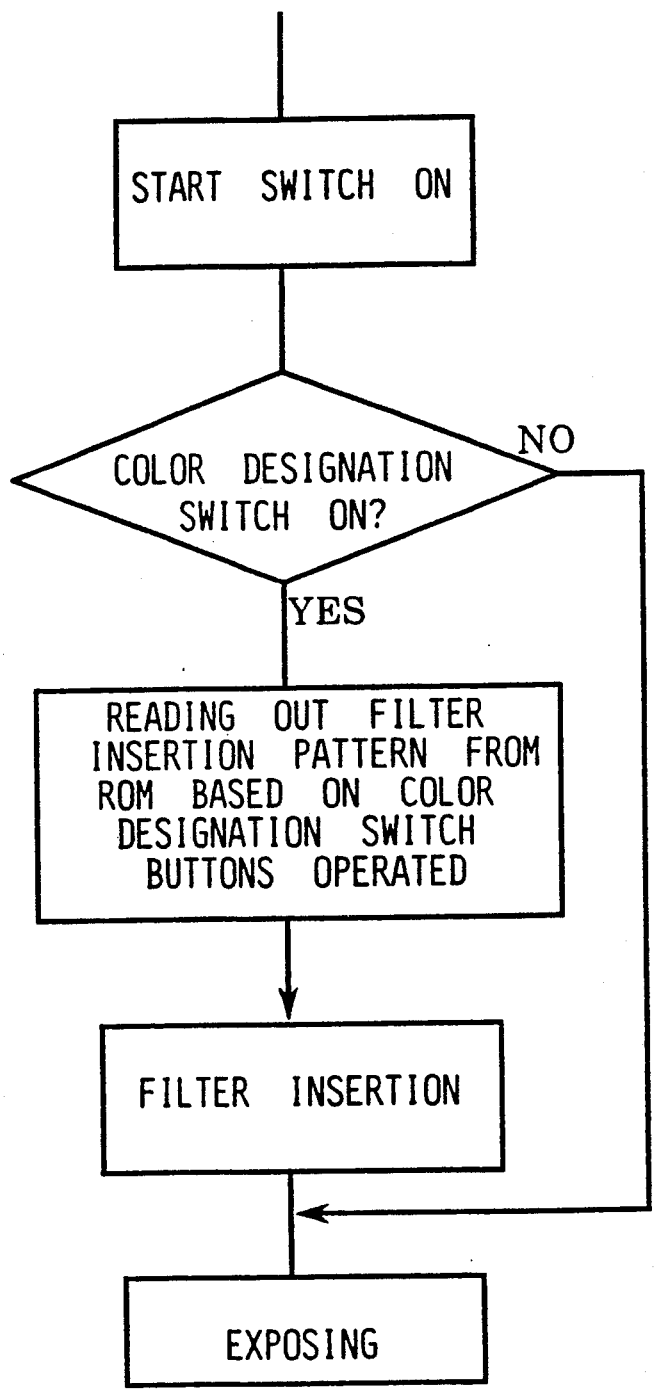
FIG. 6 is a flowchart showing operation for inserting each color light filter based on the designated color.

The amount of the insertion of each filter in the filter unit 8 according to each color designated by depressing the push button switch in the color designation switch unit 42 is decided based on the data stored in ROM 43. Preferably, the control section 82 operates the filter unit 8 so as to increase the amount of passage or penetration of the hue color relating to the complementary color of the color designated by the non-basic color designation, that is, as the flowchart of the above-mentioned operation is shown in FIG. 6, when any switch in the color designation switch unit 42 is pushed, the amount of the insertion of the filter corresponding to the designated color is read from the ROM 43 by CPU 44. Each filter in the filter unit 8 is inserted into the optical path to cover a predetermined amount of the image area according to the filter insertion pattern stored in ROM 43 by a filter driving device 45 including stepping motors 8aM–8cM etc., and exposure then takes place.

The present invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein. For instance, the cyanogen filter, the magenta filter, and the yellow filter are used as a light filter in an above-mentioned embodiment.

Figure 7:
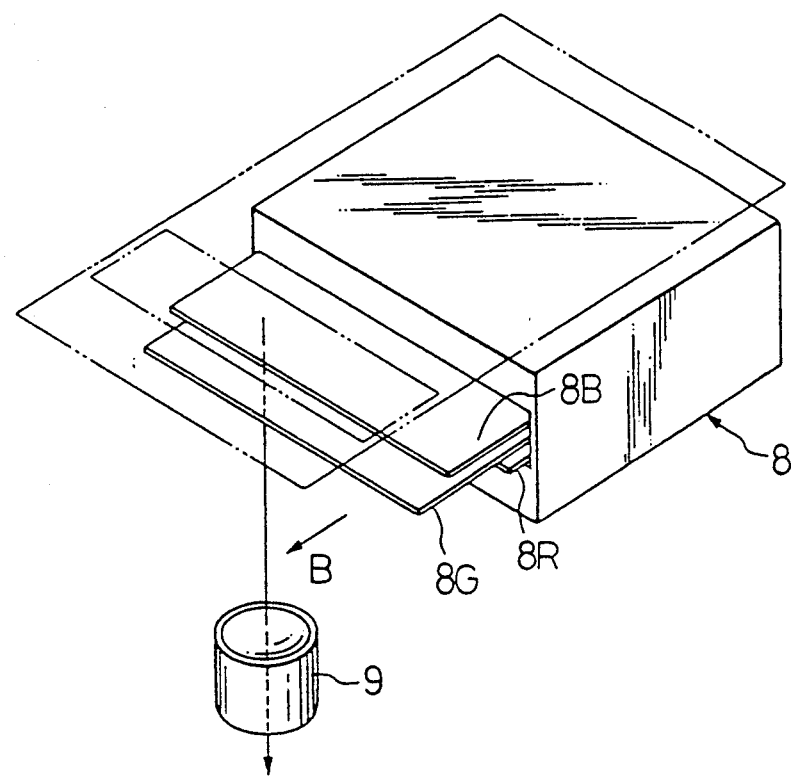
FIG. 7 is a perspective view showing an arrangement of a filter unit according to an other embodiment.

However, as shown in FIG. 7, a red filter 8R for interrupting red light, a green filter 8G for interrupting green light and a blue filter 8B for interrupting blue light, may be used. For instance, if the blue filter is inserted to intercept ⅔ of the image area and the red filter is inserted to intercept ⅓ of the image area, respectively, and the green filter is not inserted, purple is emphasized in the output image.

What is claimed is:

1. An image recording apparatus for recording an output color image on an image recording medium, comprising:
    basic color designation means for designating three basic primary colors respectively;
    non-basic color designation means for designating hue colors between each of the three basic primary colors;
    a plurality of color light filters in a relation of complementary colors to said three basic colors respectively;
    filter drive means for inserting and removing each color light filter into and from an optical path; and
    filter insertion amount control means for operating said filter drive means based on the color designated by said basic color designation means and said non-basic color designation means and controlling an amount of insertion of the color filters into said optical path, wherein said filter insertion amount control means operates said filter drive means so as to increase an amount of passage of the hue color relating to the complimentary color of the color designated by the non-basic color designation means, and controls the amount of insertion of each of the color light penetration filters.

2. The image recording apparatus according to claim 1, wherein said three basic primary colors designated by said basic color designation means include red, green and blue; and
    said color light filters include: a cyanogen filter for interrupting a red wave length light and allowing passage of a green wave length and a blue wave length light; a magenta filter for interrupting a green wave length light and allowing passage of a red wave length light and a blue wave length light; and a yellow filter for interrupting a blue wave length light and allowing passage of a red wave length and a green wave length light.

3. The image recording apparatus according to claim 2, wherein said hue colors designated by said non-basic color designation means are provided between each of said three basic primary colors.

4. The image recording apparatus according to claim 3, wherein said filter insertion amount control means operates said filter drive means so as to increase the amount of passage of the hue color relating to the complementary color of the color designated by said non-basic color designation means, and controls the amount of the insertion of each of the cyanogen filter, magenta filter and yellow filter.

5. The image recording apparatus according to claim 3, wherein said non-basic color designation means comprises a plurality of color designation buttons each identifying a designated color, the plurality of color designation buttons being provided on an operation panel of the apparatus for selection by an operator.

6. The image recording apparatus according to claim 1, wherein said three basic primary colors designated by said basic color designation means include red, green and blue; and said color filters include a red filter for interrupting a cyanogen color light, a green filter for interrupting a magenta color light, and a blue filter for interrupting a yellow color light.

7. The image recording apparatus according to claim 6, wherein said hue colors designated by said non-basic color designation means are provided between each of said basic primary colors.

8. The image recording apparatus according to claim 7, wherein said filter insertion amount control means operates said filter drive means so as to increase the amount of passage of the hue color relating to the complementary color of the color designated by said non-basic color designation means, and controls the amount of the insertion of each of the red filter, green filter and blue filter.

9. The image recording apparatus according to claim 7, wherein said non-basic color designation means comprises a plurality of color designation buttons each identifying a designated color, the plurality of color designation buttons being provided on an operation panel of the apparatus for selection by an operator.

10. An image recording apparatus for recording an output color image on an image recording medium comprising:
    a light source for irradiating an original;
    an exposure device at which an image recording medium is exposed to light reflected from the original which is irradiated by the light emitted from said light source, a light path being defined between the light source and the exposure device;
    a pressure developing device at which a developer medium and said exposed image recording medium are superposed with each other and pressed for forming an output image on said developer medium by a chromogenic reaction;
    basic color designation means for designating three basic primary colors respectively;
    non-basic color designation means for designating hue colors between each of the three basic primary colors;
    a plurality of color light filters in the relation of complementary colors to said three basic colors respectively;
    filter drive means for inserting and removing each color light filter into and from the optical path; and
    filter insertion amount control means for operating said filter drive means based on the color designated by said basic color designation means and said non-basic color designation means and controlling an amount of insertion of the color light filters into said optical path, wherein said filter insertion amount control means operates said filter drive means so as to increase an amount of passage of the hue color relating to the complimentary color of the color designated by the non-basic color designation means, and controls the amount of insertion of each of the color light penetration filters.

11. The image recording apparatus according to claim 10, wherein said three basic primary colors designated by said color designation means include red, green and blue; and said color light filters include: a cyanogen filter for interrupting a red wave length light and allowing passage of a green wave length light and a blue wave length light; a magenta filter for interrupting a green wave length light and allowing passage of a red wave length light and a blue wave length light; and a yellow filter for interrupting a blue wave length light and allowing passage of a red wave length light and a green wave length light.

12. The image recording apparatus according to claim 11, wherein said hue colors designated by said non-basic color designation means are provided between each of said three basic primary colors.

13. The image recording apparatus according to claim 12, wherein said filter insertion amount control means operates said filter drive means so as to increase the amount of passage of the hue color relating to the complementary color of the color designated by said non-basic color designation means, and controls the amount of the insertion of each of the cyanogen filter, magenta filter and yellow filter.

14. The image recording apparatus according to claim 12, wherein said non-basic color designation means comprises a plurality of color designation buttons each identifying a designated color, the plurality of color designation buttons being provided on an operation panel of the apparatus for selection by an operator.

15. The image recording apparatus according to claim 10, wherein said basic primary colors designated by said basic color designation means include red, green and blue; and said color light filters include a red filter for interrupting a cyanogen color light, a green filter for interrupting a magenta color light, and a blue filter for interrupting a yellow color light.

16. The image recording apparatus according to claim 15, wherein said hue colors designated by said non-basic color designation means are provided between each of said basic primary colors.

17. The image recording apparatus according to claim 16, wherein said filter insertion amount control means operates said filter drive means so as to increase the amount of passage of the hue color relating to the complementary color of the color designated by said non-basic color designation means, and controls the amount of the insertion of each of the cyanogen filter, magenta filter and yellow filter.

18. The image recording apparatus according to claim 16, wherein said non-basic color designation means comprises a plurality of color designation buttons, each identifying a designated color, the plurality of color designation buttons being provided on an operation panel of the apparatus for selection by an operator.

19. An image recording apparatus for recording an output color image on an image recording medium, comprising:

three basic color designation members operable to designate three basic primary colors respectively;

plural non-basic color designation members operable to designate plural hue colors, at least one of said plural hue colors being predetermined between two of three basic primary colors, said plural non-basic color designation members individually corresponding to said plural hue colors:

a plurality of color light filters in a relation of complementary colors to said three basic colors respectively;

filter drive means for inserting and removing each color light filter into and from an optical path; and filter insertion amount control means for operating said filter drive means based on the color designated by said basic color designation members and said non-basic color designation members, and controlling an amount of insertion of the color filters into said optical path.

* * * * *